(12) United States Patent
Hideki

(10) Patent No.: US 7,061,013 B2
(45) Date of Patent: Jun. 13, 2006

(54) PHASE CHANGE STORAGE CELLS FOR MEMORY DEVICES, MEMORY DEVICES HAVING PHASE CHANGE STORAGE CELLS AND METHODS OF FORMING THE SAME

(75) Inventor: Horii Hideki, Seoul (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 10/787,634

(22) Filed: Feb. 26, 2004

(65) Prior Publication Data
US 2004/0188735 A1  Sep. 30, 2004

(30) Foreign Application Priority Data
Mar. 4, 2003 (KR) .................. 10-2003-0013416

(51) Int. Cl.
*H01L 29/18* (2006.01)
*H01L 29/00* (2006.01)

(52) U.S. Cl. .................. 257/42; 257/537; 365/148
(58) Field of Classification Search .................. None
See application file for complete search history.

(56) References Cited

U.S. PATENT DOCUMENTS

| 6,507,061 | B1 | 1/2003 | Hudgens et al. | |
| 2003/0006535 | A1* | 1/2003 | Hennessey et al. | 264/403 |
| 2004/0038445 | A1* | 2/2004 | Lowrey et al. | 438/103 |
| 2004/0113137 | A1* | 6/2004 | Lowrey | 257/5 |

FOREIGN PATENT DOCUMENTS

KR  KO 1999-67038  8/1999

OTHER PUBLICATIONS

Notice to File a Response for Korean Application No. 10-2003-0013416 mailed on Mar. 31, 2005.

* cited by examiner

*Primary Examiner*—Ngân V. Ngô
(74) *Attorney, Agent, or Firm*—Myers Bigel Sibley & Sajovec, PA

(57) ABSTRACT

Storage cells for a phase change memory device and phase change memory devices are provided that include a first phase change material pattern and a first high-resist phase change material pattern on the first phase change material pattern. The first high-resist phase change material pattern has a higher resistance than the first phase change material pattern. Methods of fabricating such storage cells and/or memory devices are also provided.

19 Claims, 5 Drawing Sheets

PHASE CHANGE STORAGE CELLS FOR MEMORY DEVICES, MEMORY DEVICES HAVING PHASE CHANGE STORAGE CELLS AND METHODS OF FORMING THE SAME

CLAIM OF PRIORITY

This application claims the priority from Korean Patent Application No. 2003-13416, filed on 4 Mar. 2003, in the Korean Intellectual Property Office, the disclosure of which is hereby incorporated by reference in its entirety as if fully set forth herein.

FIELD OF THE INVENTION

The present invention relates to non-volatile memory devices and method of forming the same. More specifically, the present invention relates to phase change memory devices and methods of forming the same.

BACKGROUND OF THE INVENTION

Non-volatile memory devices retain their stored data even when their power supplies are interrupted. Typical, non-volatile memory devices adopt flash memory cells having a stacked gate structure. The stacked gate structure typically includes a tunnel oxide, a floating gate, an intergate dielectric, and a control gate electrode that are stacked in the order listed.

New non-volatile memory devices, e.g., phase change memory devices, have been suggested in recent years for use instead of conventional flash memory devices. FIG. 1 is a graph illustrating the characteristic of a phase change material, in which a transverse axis denotes time T and a longitudinal axis denotes the temperature TMP applied to the phase change material. Referring to FIG. 1, if the phase change material is heated to a temperature higher than a melting temperature Tm during a first duration T1 and then quickly cools, it becomes amorphous (see curve 1). On the other hand, if the phase change material is heated to a temperature lower than the melting temperature Tm and higher than a crystallization temperature Tc during a second duration T2 longer than the first duration T1 and then cools, it becomes crystalline (see curve 2). In this case, the resistivity of the amorphous-state material is higher than that of the crystalline-state material. Accordingly, in read mode, the current flowing through the phase change material is detected to discriminate whether the information stored in the phase change memory cell is a logic "1" or a logic "0." Germanium (Ge), tellurium (Te), and stibium (Sb) containing compounds are widely used as the phase change material.

Typically, the heat for changing the state of the phase change material employs a certain number of Joules of energy that is converted to heat. The heat corresponding to the Joules of energy is generated using the resistivity of the phase change material and the amount of operation current flowing through the phase change material. The operation current is the current used in a program operation for writing data or a read operation for reading data.

As semiconductor devices are scaled down, typically, the line width of the devices and the amount of power consumed power is reduced. That is, the amount of current and/or voltage supplied to a semiconductor device or a MOS transistor is reduced. Likewise, the amount of current used in deciding a state of a memory cell is also, typically, reduced. Therefore, it may be difficult to supply sufficient operational current to generate the heat needed for changing a state of the phase change material while operating under such low power conditions.

SUMMARY OF THE INVENTION

Embodiments of the present invention provide storage cells for a phase change memory device and phase change memory devices that include a first phase change material pattern and a first high-resist phase change material pattern on the first phase change material pattern. The first high-resist phase change material pattern has a higher resistance than the first phase change material pattern.

In particular embodiments of the present invention, a second phase change material pattern is provided on the first high-resist phase change material pattern such that the first high-resist phase change material pattern is interposed between the first and second phase change material patterns. The first and second phase change material patterns and the first high-resist phase change material pattern may be crystalline.

In further embodiments of the present invention, the first phase change material pattern is made of a material comprising tellurium (Te) and/or selenium (Se). The first high-resist phase change material pattern may be oxidized phase change material and/or nitrified phase change material. In embodiments where the first high-resist phase change material pattern comprises oxidized phase change material the oxidized phase change material may include tellurium (Te) and/or selenium (Se) and oxygen (O). In embodiments where the first high-resist phase change material pattern comprises nitrified phase change material and the nitrified phase change material may include tellurium (Te) and/or selenium (Se) and nitrogen (N).

In additional embodiments of the present invention, a barrier pattern is provided on one of the first and second phase change material patterns and opposite the first high-resist phase change material pattern, the barrier pattern comprising a conductive layer.

In other embodiments of the present invention, a lower interlayer dielectric is provided on a semiconductor substrate. The first phase change material pattern is on the lower interlayer dielectric. A lower plug is configured to connect a predetermined region of the semiconductor substrate to the first phase change material pattern through the lower interlayer dielectric. An upper interlayer dielectric is provided on the lower interlayer dielectric, the first and second phase change material patterns and the first high-resist phase change material pattern. An interconnection is provided on the upper interlayer dielectric. An upper plug is configured to connect the second phase change material pattern to the interconnection through the upper interlayer dielectric.

In further embodiments of the present invention, a phase change memory device includes a lower interlayer dielectric on a semiconductor substrate and a plurality of phase change material patterns that are sequentially stacked on the lower interlayer dielectric. A plurality of high-resist phase change material patterns are provided interposed between adjacent ones of the phase change material patterns. The high-resist phase change material patterns have a higher resistance than the phase change material patterns. The phase change material patterns and the high-resist phase change material patterns provide an information storage component.

In still further embodiments of the present invention, the phase change material patterns and the high-resist phase change material patterns are crystalline. The phase change material patterns may include tellurium (Te) and/or selenium (Se). The high-resist phase change material patterns may include oxidized phase change material and/or nitrified phase change material. In embodiments where the high-resist phase change material patterns comprise oxidized phase change material and the oxidized phase change material may include tellurium (Te) and/or selenium (Se) and oxygen (O). In embodiments where the high-resist phase change material patterns comprise nitrified phase change material and the nitrified phase change material may include tellurium (Te) and/or selenium (Se) and nitrogen (N).

In additional embodiments of the present invention, opposing sides of the information storage component are composed of the phase change material patterns. Furthermore, a conductive layer may be provided on the information storage component to provide a barrier pattern on the information storage component.

In still further embodiments of the present invention, a lower plug is connected to a predetermined region of the semiconductor substrate and the information storage component through the lower interlayer dielectric. An upper interlayer dielectric is provided on the lower interlayer dielectric and the information storage component and an interconnection is provided on the upper interlayer dielectric. An upper plug is connected to the information storage component and the interconnection through the upper interlayer dielectric.

Methods of fabricating storage cells and/or phase change memory devices are also provided.

DESCRIPTION OF THE PREFERRED EMBODIMENT

Figure 1:
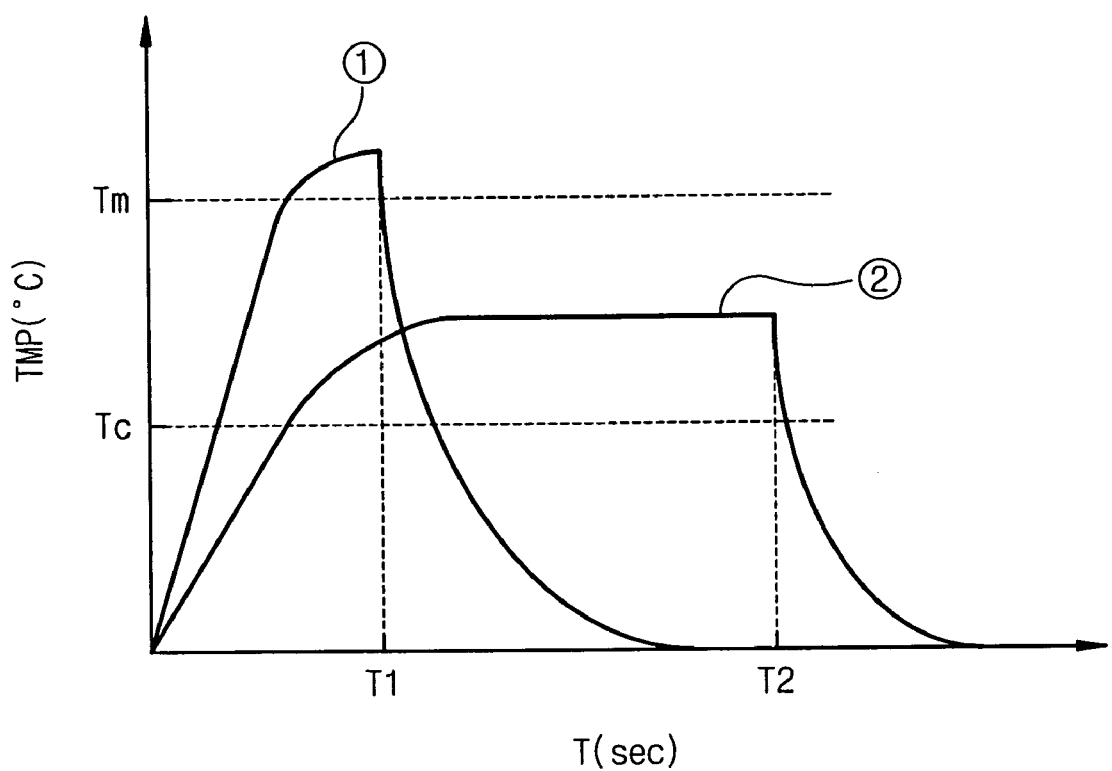
FIG. 1 is a graph illustrating the characteristic of a phase change material for use in a phase change memory cell.

The present invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the height of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2:
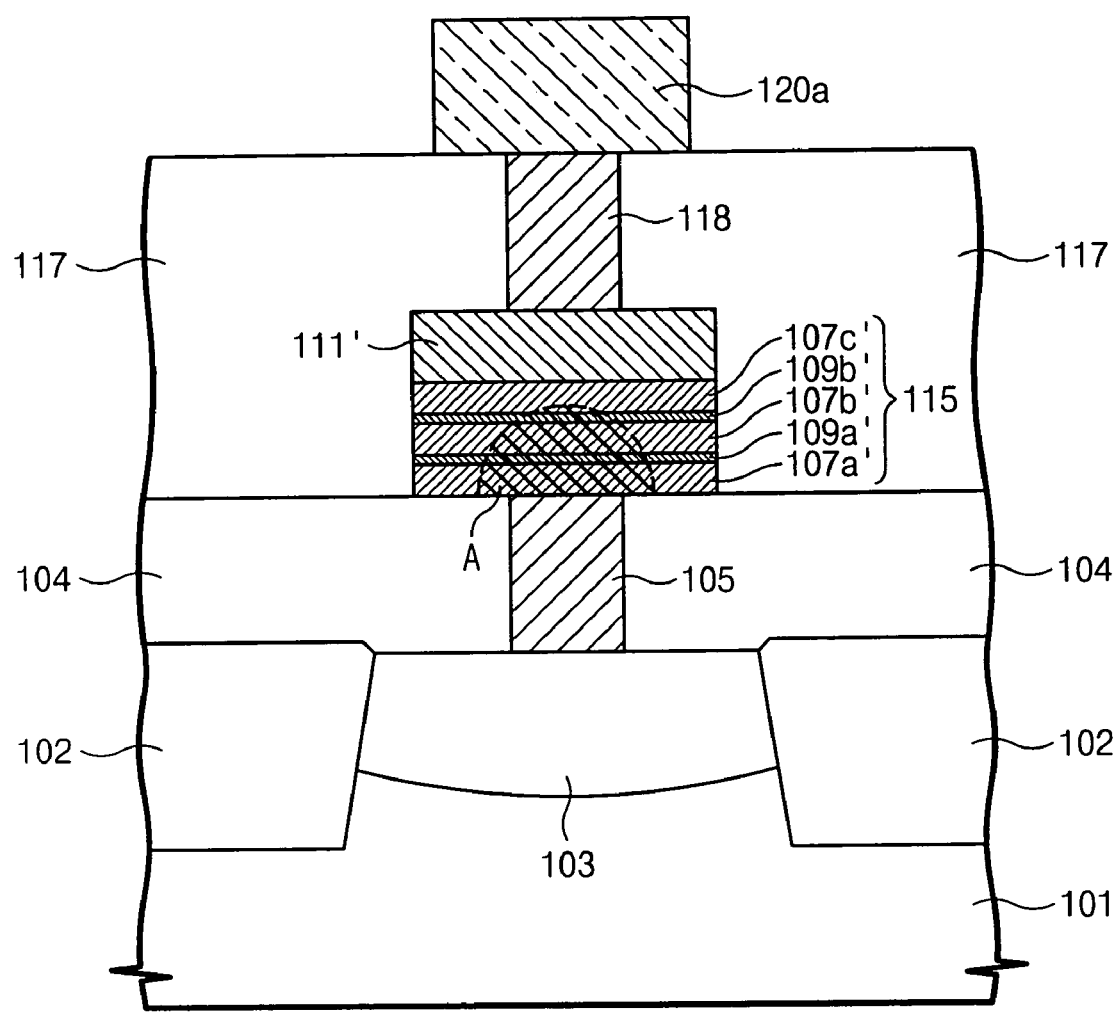
FIG. 2 is a cross-sectional view of a phase change memory device according to embodiments of the present invention.

A phase change memory device according to embodiments of the present invention is now described below with reference to FIG. 2. As seen in FIG. 2, a device isolation layer 102 is formed at a predetermined region of a semiconductor substrate 101 to define one or more active regions. The device isolation layer 102 may be a trench isolation layer. An impurity diffusion layer 103 is disposed at the active region. The impurity diffusion layer 103 may be a source/drain region of a MOS transistor (not shown).

A lower interlayer dielectric 104 is disposed to cover the impurity diffusion layer 103 and the device isolation layer 102. The lower interlayer dielectric 104 may be made of silicon oxide. A lower plug 105 is disposed in the lower interlayer dielectric 104 and is configured to electrically connect to a predetermined region of the impurity diffusion layer 103 through the lower interlayer dielectric 104. The lower plug 105 is a conductive layer and, in certain embodiments of the present invention, is made of TiN, TiAlN, TiBN, TiSiN, TaN, TaAlN, TaBN, TaSiN, WN, WBN, WSiN, WAlN, ZrN, ZrSiN, ZrAlN, ZrBN, MoN, Al, Al—Cu, Al—Cu—Si, WSix, Ti, W, Mo, Ta, TiW, and/or Cu. In some cases, a conductive diffusion barrier layer (not shown) may be interposed between the lower plug 105 and the impurity diffusion layer 103.

An information storage component 115 and a barrier pattern 111' are sequentially stacked on the lower interlayer dielectric 104. The information storage component 115 is electrically connected to a surface of the lower plug 105 opposite the impurity diffusion layer 103. The information storage component 115 is composed of stacked phase change material patterns 107a', 107b' and 107c' and high-resist phase change material patterns 109a' and 109b' each being interposed between the adjacent phase change material patterns 107a', 107b' and 107c'. While three phase change material patterns 107a', 107b' and 107c' and two high-resist phase change material patterns 109a' and 109b' are illustrated in FIG. 2, other numbers of patterns may be provided. For example, in certain embodiments, at least one each of the phase change material pattern and the high-resist phase change material pattern may be provided. In other embodiments, at least two of the phase change material patterns and at least one of the high-resist phase change material patterns are provided. The high-resist phase change material patterns 109a' and 109b' have a higher resistance than the phase change material patterns 107a', 107b' and 107c'. In particular embodiments of the present invention, opposing first and second sides of the information storage component 115 are made of the phase change material patterns 107a' and 107c'. As shown in FIG. 2, in particular embodiments of the present invention, the information storage component 115 has a structure in which a first phase change material pattern 107a', a first high-resist phase change material pattern 109a', a second phase change material pattern 107b', a second high-resist phase change material pattern 109b', and a third phase change material pattern 107c' which are stacked in the order listed. Additionally, the information storage component 115 may have four or more of the phase change material patterns and three of more of the high-resist phase change material patterns.

The phase change material patterns 107a', 107b' and 107c' and the high-resist phase change material patterns 109a' and 109b' have two stable states, i.e., an amorphous state and a crystalline state, based on a temperature. In certain embodiments, the phase change material patterns 107a', 107b' and 107c' and the high-resist phase change material patterns 109a' and 109b' have the crystalline state. In particular, in such embodiments an initial state of the information storage component 115 is the crystalline state and a portion "A" of the information storage component 115 changes to have the crystalline state or the amorphous state.

A crystalline-state information storage component may need a smaller amount of operational current than an amorphous-state information storage component. Thus, in the case where data is programmed/erased to/from the crystalline-state information storage component, the data can be discriminated even if a current path in the crystalline-state information storage component partially changes to have the amorphous state or the crystalline state. On the other hand, in the case where data is programmed/erased to/from an amorphous-state information storage component, the data may be discriminated when the current path disposed in the information storage component entirely changes to have the amorphous state or the crystalline state. That is, discriminating a difference between the resistivity of the crystalline state and the resistivity of the amorphous state may be easier than discriminating a resistance difference based on a thickness of the information storage component. Thus, a crystalline-state information storage component may have a smaller phase-change portion "A" than an amorphous-state information storage component.

In certain embodiments of the present invention, the phase change material patterns 107a', 107b' and 107c' are made of tellurium (Te) and/or selenium (Se), which are chalcogenide elements. For example, the phase change material patterns 107a', 107b' and 107c' may be made of Ge—Sb—Te, As—Sb—Te, As—Ge—Sb—Te, Sn—Sb—Te, Sn—In—Sb—Te, 5A group element-Sb—Te, 6A group element-Sb—Te, 5A group element-Sb—Se, and/or 6A group element-Sb—Se.

In certain embodiments of the present invention, the high-resist phase material patterns 109a' and 109b' are made of oxidized phase change material and/or nitrified phase change material. The oxidized phase change material may contain tellurium (Te) and/or selenium (Se) and oxygen (O). The nitrified phase change material contains tellurium (Te) and/or selenium (Se) and nitrogen (N). For example, the high-resist phase material patterns 109a' and 109b' may include Ge—Sb—Te, As—Sb—Te, As—Ge—Sb—Te, Sn—Sb—Te, Sn—In—Sb—Te, 5A group element-Sb—Te, 6A group element-Sb—Te, 5A group element-Sb—Se, and/or 6A group element-Sb—Se. Therefore, the oxidized phase change material and/or the nitrified phase change material have two stable states that are intrinsic properties of a phase change material and have a higher resistance than the phase change material. For example, the oxidized phase change material may be the respective phase change materials containing oxygen, and the nitrified phase change material may be the respective phase change materials containing nitrogen.

The barrier pattern 111' disposed on the information storage component 115 is a conductive layer which may be made of TiN, TiAlN, TiBN, TiSiN, TaN, TaAlN, TaBN, TaSiN, WN, WBN, WSiN, WAlN, ZrN, ZrSiN, ZrAlN, ZrBN, MoN, Al, Al—Cu, Al—Cu—Si, WSix, Ti, W, Mo, Ta, TiW, and/or Cu. A sidewall of the barrier pattern 111' may be substantially coplanar with a sidewall of the information storage component 115. Although not shown in the drawing, the barrier pattern 111' may be interposed between a lower side of the information storage component 115 and the lower interlayer dielectric 104. In this case, the lower plug 105 is in direct contact with an adjacent side of the barrier pattern 111'.

An upper interlayer dielectric 117 is formed to cover the lower interlayer dielectric 104, the information storage component 115, and the barrier pattern 111'. The upper interlayer dielectric 117 may be made of silicon oxide, silicon nitride and/or silicon oxynitride. An upper plug 118 is disposed in the upper interlayer dielectric 117 and is configured to electrically connect to the barrier pattern 111' through the upper interlayer dielectric 117. In the case where the barrier pattern 111' is disposed below the information storage component 115, the upper plug 118 may be connected to the side of the information storage component 115 opposite the barrier pattern 111'. The upper plug 118 is a conductive layer and may, for example, be made of TiN, TiAlN, TiBN, TiSiN, TaN, TaAlN, TaBN, TaSiN, WN, WBN, WSiN, WAlN, ZrN, ZrSiN, ZrAlN, ZrBN, MoN, Al, Al—Cu, Al—Cu—Si, WSix, Ti, W, Mo, Ta, TiW, and/or Cu. An interconnection 120a is disposed on the upper interlayer dielectric 117 to be electrically connected to the side of the upper plug 118 opposite the information storage component 115. The interconnection 120a may be made of aluminum, tungsten and/or copper. Further, the interconnection 120a may correspond to a bitline of a memory device.

The MOS transistor (not shown) and the information storage component 115 may constitute a unit cell of a memory device. That is, a gate electrode (not shown) of the MOS transistor corresponds to a wordline, and the information storage component 115 is a storage cell for storing data therein.

The above-described phase change memory device generates heat at an interface between the information storage component 115 and the lower plug 105 and in the information storage component 115 by means of operation current (program or erase operation current) supplied from the interconnection 120a or the impurity diffusion layer 103. Thus, a portion "A" of the information storage component 115 changes in phase. Since the resistance of the information storage component 115 is increased by the high-resist phase change material patterns 109a' and 109b', the heat generated according to Joule's Law increases. As a result, the operation current may be reduced by the increase in the resistance of the information storage component 115. The increased resistivity of the information storage component 115 is described below with reference to FIG. 3.

Figure 3:
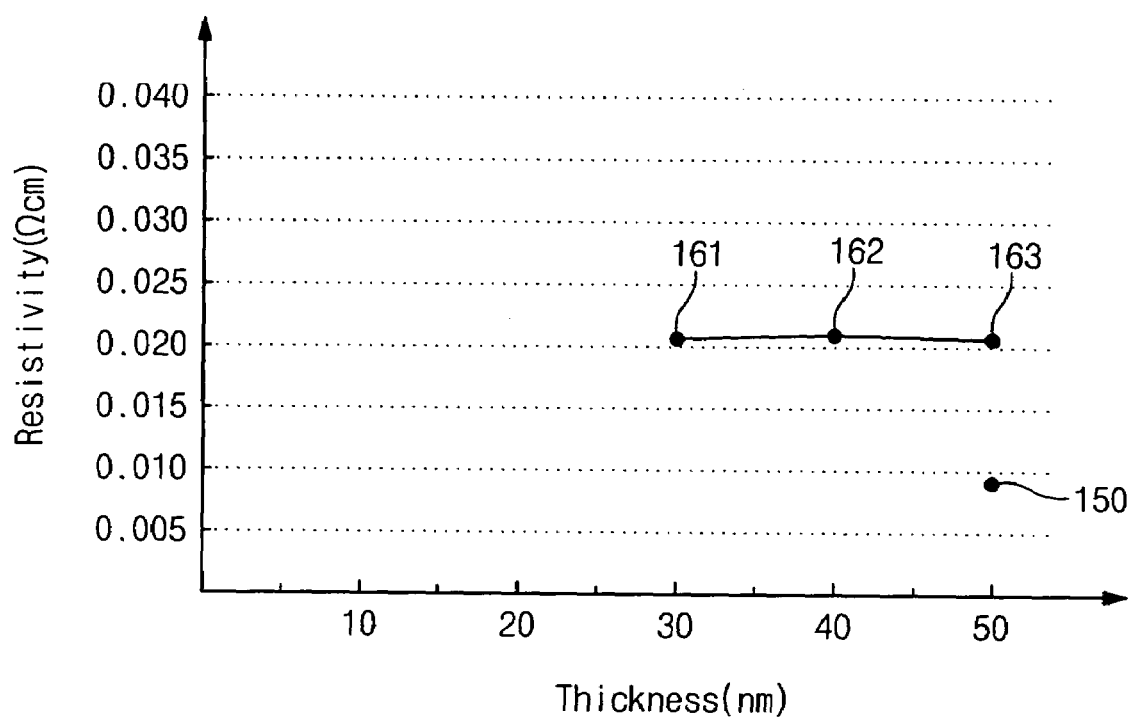
FIG. 3 is a graph illustrating the resistivity of an information storage component in a phase change memory device according to embodiments of the present invention.

In FIG. 3, a transverse axis of the graph denotes the thickness of an information storage component and the longitudinal axis denotes the resistivity of the information storage component. Referring to FIG. 2 and FIG. 3, points 161, 162 and 163 are test values of information storage components according to the present invention, and the point 150 is a test value of a conventional information storage component of a uniform phase change material. The information storage component 115 of the point 161 includes three phase change material patterns 107a', 107b' and 107c' and two high-resist phase change material patterns 109a' and 109b' and has a thickness of 30 nanometers. The information storage component 115 of the point 162 includes four phase change material patterns 107a', 107b' and 107c' and three high-resist phase change material patterns 109a' and 109b' and has a thickness of 40 nanometers. The information storage component 115 of the point 163 includes five phase change material patterns 107a', 107b' and 107c' and four high-resist phase change material patterns 109a' and 109b' and has a thickness of 50 nanometers. The information storage component of the point 150 includes a phase change material layer and has a thickness of 50 nanometers.

As illustrated in FIG. 3, the resistivity of the points 161, 162 and 163 is about 20 mΩ-cm, and the resistivity of the point 150 is about 8 mΩ-cm. That is, the information storage components 115 of the points 161, 162 and 163 have an increased resistance due to the high-resist phase change material patterns 109a' and 109b'. Thus, for the same current, according to Joule's Law, the heat generated at the information storage components of the points 161, 162 and 163 increases over that generated by the information storage component of point 150. Or, stated differently, the information storage components having the properties associated with the points 161, 162 and 163 may generate about the same amount of heat as that generated by the information storage component having the properties associated with the point 150 at a lower level of operational current. As a result, the information storage component according to embodiments of the present invention may generate enough heat to change state even at a reduced level of operation current. Thus, the phase change memory device according to embodiments of the present invention may be suitable for higher levels of integration.

Figure 4:
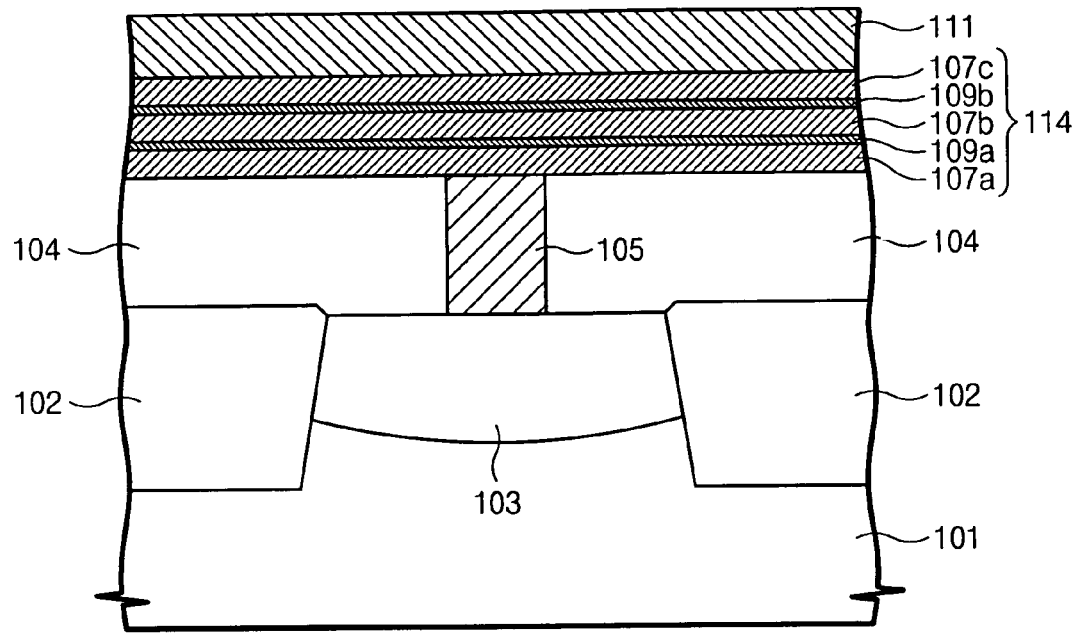
FIG. 4 through FIG. 6 are cross-sectional views illustrating methods of forming the phase change memory device illustrated in FIG. 2.

Method for forming the phase change memory devices of FIG. 2 are described below with reference to FIG. 4 through FIG. 6. Referring to FIG. 4, a device isolation layer 102 is formed at a semiconductor substrate 101 to define an active region. The device isolation layer 102 may be a trench isolation layer. Impurities are selectively implanted into the active region to form an impurity diffusion layer 103 which may be the source/drain of a MOS transistor. A lower interlayer dielectric 104 is blanket formed on a surface of a semiconductor substrate 101 including the impurity diffusion layer 103. The lower interlayer dielectric 104 may be made of silicon oxide. A lower plug 105 is formed to contact a predetermined region of the impurity diffusion layer 103 through the lower interlayer dielectric 104. The lower plug 105 is a conductive layer which may be made of TiN, TiAlN, TiBN, TiSiN, TaN, TaAlN, TaBN, TaSiN, WN, WBN, WSiN, WAlN, ZrN, ZrSIN, ZrAlN, ZrBN, MoN, Al, Al—Cu, Al—Cu—Si, WSix, Ti, W, Mo, Ta, TiW, and/or Cu.

An information storage layer 114 and a barrier layer 111 are sequentially blanket formed on a surface of the lower interlayer dielectric 104 including the lower plug 105. The information storage layer 114 includes a plurality of layers that are sequentially stacked. More specifically, the information storage layer 114 includes the phase change material layers 107a, 107b and/or 107c and the high-resist phase change material layers 109a and/or 109b each being interposed between the adjacent phase change material layers 107a, 107b and 107c. In FIG. 4, the information storage layer 114 is composed of three phase change material layers 107a, 107b and 107c and two high-resist phase change material layers 109a and 109b. However, other numbers of layers may be utilized. In FIG. 4, the information storage layer 114 is composed of a first phase change material layer 107a, a first high-resist phase change material layer 109a, a second phase change material layer 107b, a second high-resist phase change material layer 109b, and a third phase change material layer 107c which are sequentially stacked in the order listed. In particular embodiments of the present invention, the lowest layer and the highest layer of the information storage layer 114 are made of the phase change materials 107a and 107c.

The high-resist phase change material layers 109a and 109b have a higher resistance than the phase change material layers 107a, 107b, and 107c. In certain embodiments of the present invention, the phase change material layers 107a, 107b and 107c and the high-resist phase change material layers 109a and 109b have an initial crystalline state.

In particular embodiments of the present invention, the phase change material layers 107a, 107b and 107c are made of a material containing tellurium (Te) and/or selenium (Se) that are chalcogenide elements. For example, the phase change material layers 107a, 107b and 107c may be made of Ge—Sb—Te, As—Sb—Te, As—Ge—Sb—Te, Sn—Sb—Te, Sn—In—Sb—Te, 5A group element-Sb—Te, 6A group element-Sb—Te, 5A group element-Sb—Se, and/or 6A group element-Sb—Se. The high-resist phase change material layers 109a and 109b are made of oxidized phase change material and/or nitrified phase change material. The oxidized phase change material may contain tellurium (Te) and/or selenium (Se) and oxygen (O). The nitrified phase change material may contain tellurium (Te) and/or selenium (Se) and nitrogen (N).

The phase change material layers 107a, 107b and 107c may be formed by chemical vapor deposition (CVD) and/or atomic layer deposition (ALD). The high-resist phase change material layers 109a and 109b may be formed by oxidizing and/or nitrifying surfaces of the underlying phase change material layers 107a and 107b, respectively. The high-resist phase change material layers 109a and 109b may also be formed by physical vapor deposition (PVD), CVD and/or ALD. In the case where the high-resist phase change material layers 109a and 109b are formed by PVD, they may be formed by an oxygen reactive sputtering manner or a nitride reactive sputtering manner.

The barrier layer 111 is a conductive layer that may be made of TiN, TiAlN, TiBN, TiSiN, TaN, TaAlN, TaBN, TaSiN, WN, WBN, WSiN, WAlN, ZrN, ZrSiN, ZrAlN, ZrBN, MoN, Al, Al—Cu, Al—Cu—Si, WSix, Ti, W, Mo, Ta, TiW, and/or Cu. Although not shown in the drawing, the positions of the information storage layer 114 and the barrier layer 111 are interchangeable. That is, after forming the barrier layer 111 on the lower interlayer dielectric 104, the information storage layer 114 may be formed on the barrier layer 111.

Figure 5:
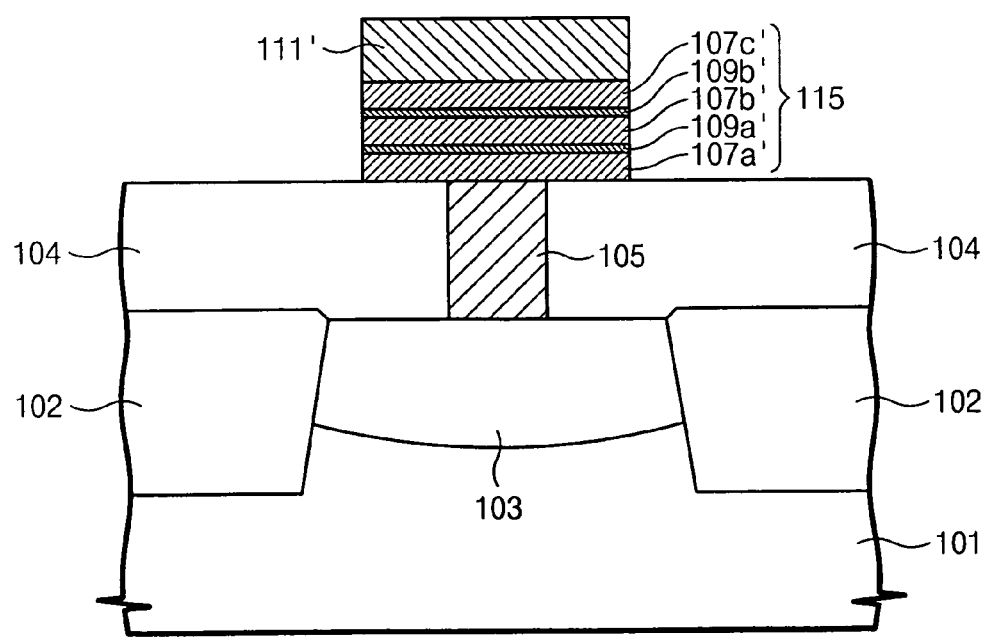
Figure 6:
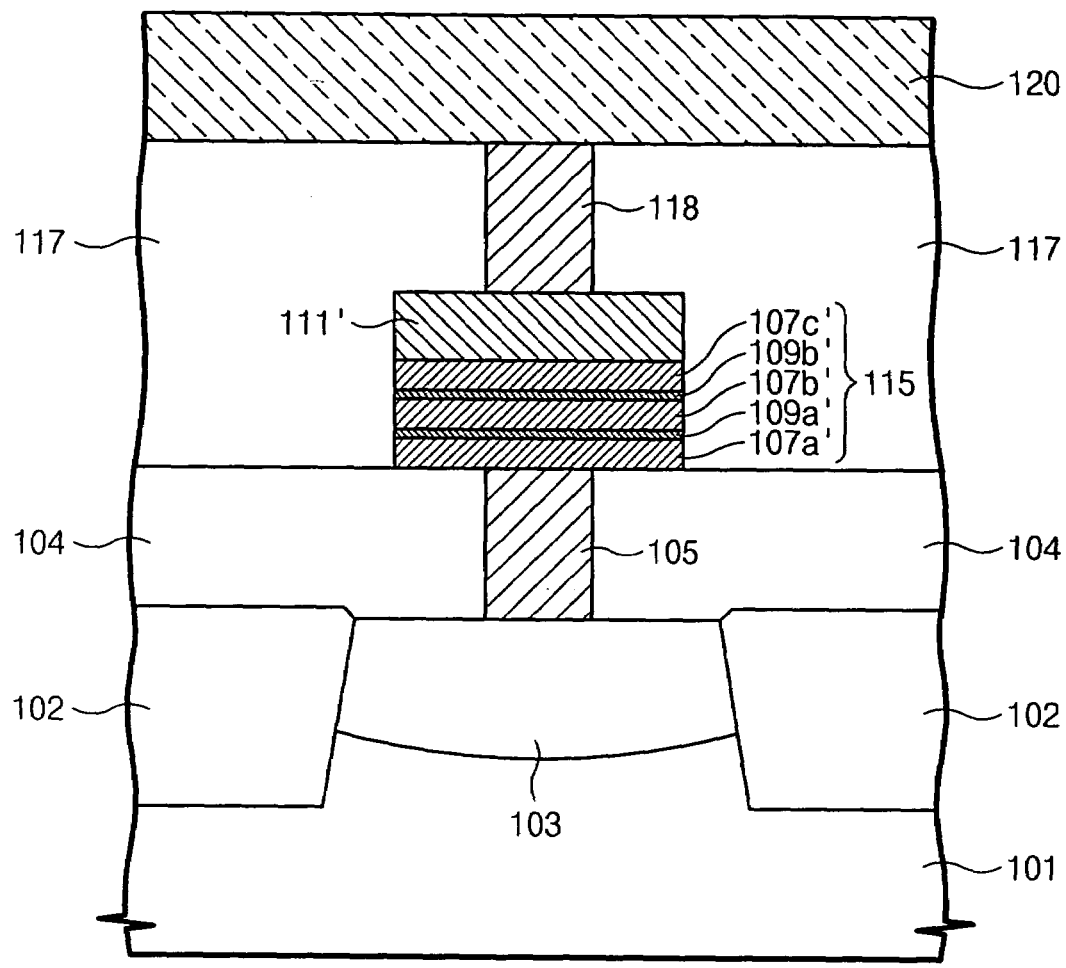

Referring to FIG. 5 and FIG. 6, the barrier layer 111 and the information storage layer 114 are successively patterned to form an information storage component 115 and a barrier pattern 111'. The information storage component 115 is electrically connected to an adjacent side of the lower plug 105. The information storage component 115 includes at least two phase change material patterns 107a', 107b' and 107c', which are sequentially stacked, and at least one high-resist phase change material patterns 109a' and 109b' interposed between the adjacent phase change material patterns 107a', 107b' and 107c'.

An upper interlayer dielectric 117 is formed on a surface of a semiconductor substrate 101 including the barrier pattern 111' and the information storage component 115. A surface of the upper interlayer dielectric 117 opposite the lower interlayer dielectric 104 may be planarized. An upper plug 118 is disposed in the upper interlayer dielectric 117 and is electrically connected to the barrier pattern 111' through the upper interlayer dielectric 117.

The upper interlayer dielectric 117 may be made of silicon oxide. The upper plug 118 may be made of TiN, TiAlN, TiBN, TiSiN, TaN, TaAlN, TaBN, TaSiN, WN, WBN, WSiN, WAlN, ZrN, ZrSiN, ZrAlN, ZrBN, MoN, Al, Al—Cu, Al—Cu—Si, WSix, Ti, W, Mo, Ta, TiW, and/or Cu.

An interconnection conductive layer 120 is formed on a surface of a semiconductor substrate including the upper plug 118. The interconnection conductive layer 120 is patterned to form the interconnection 120a shown in FIG. 2. As a result, the phase change memory device of FIG. 2 is formed. The interconnection 120a may be made of aluminum, tungsten and/or copper. In the case where the interconnection 120a is made of copper, it is formed by a damascene manner where a mold insulating layer (not shown) is formed on the upper interlayer dielectric 117.

It should be understood that the foregoing is illustrative and not limiting and that obvious modifications may be made by those skilled in the art without departing from the spirit of the invention. Accordingly, the specification is intended to cover such alternatives, modifications, and equivalence as may be included within the spirit and scope of the invention as defined in the following claims.

What is claimed is:

1. A storage cell for a phase change memory device comprising:
   a first phase change material pattern;
   a first high-resist phase change material pattern on the first phase change material pattern, the first high-resist phase change material pattern having a higher resistance than the first phase change material pattern; and
   a second phase change material pattern on the first high-resist phase change material pattern such that the first high-resist phase change material pattern is interposed between the first and second phase change material patterns.

2. The storage cell of claim 1, wherein the first and second phase change material patterns and the first high-resist phase change material pattern are crystalline.

3. The storage cell of claim 1, wherein the first phase change material pattern is made of a material comprising tellurium (Te) and/or selenium (Se).

4. The storage cell of claim 1, wherein the first high-resist phase change material pattern comprises oxidized phase change material and/or nitrified phase change material.

5. The storage cell of claim 1, the first high-resist phase change material pattern comprises oxidized phase change material and wherein the oxidized phase change material contains tellurium (Te) and/or selenium (Se) and oxygen (O).

6. The storage cell of claim 1, wherein the first high-resist phase change material pattern comprises nitrified phase change material and wherein the nitrified phase change material contains tellurium (Te) and/or selenium (Se) and nitrogen (N).

7. The storage cell of claim 1, further comprising a barrier pattern on one of the first and second phase change material patterns and opposite the first high-resist phase change material pattern, the barrier pattern comprising a conductive layer.

8. A storage cell for a phase change memory device comprising:
   a first phase change material pattern;
   a first high-resist phase change material pattern on the first phase change material pattern, the first high-resist phase change material pattern having a higher resistance than the first phase change material pattern;
   a lower interlayer dielectric on a semiconductor substrate, wherein the first phase change material pattern is on the lower interlayer dielectric;
   a lower plug configured to connect a predetermined region of the semiconductor substrate to the first phase change material pattern through the lower interlayer dielectric;
   an upper interlayer dielectric on the lower interlayer dielectric, the first and second phase change material patterns and the first high-resist phase change material pattern;
   an interconnection on the upper interlayer dielectric; and
   an upper plug configured to connect the second phase change material pattern to the interconnection through the upper interlayer dielectric.

9. A phase change memory device incorporating the storage cell of claim 1.

10. A phase change memory device comprising:
    a lower interlayer dielectric on a semiconductor substrate;
    a plurality of phase change material patterns that are sequentially stacked on the lower interlayer dielectric; and
    a plurality of high-resist phase change material patterns interposed between adjacent ones of the phase change material patterns, the high-resist phase change material patterns having a higher resistance than the phase change material patterns,
    wherein the phase change material patterns and the high-resist phase change material patterns provide an information storage component.

11. The phase change memory device of claim 10, wherein the phase change material patterns and the high-resist phase change material patterns are crystalline.

12. The phase change memory device of claim 10, wherein the phase change material patterns comprise tellurium (Te) and/or selenium (Se).

13. The phase change memory device of claim 10, wherein the high-resist phase change material patterns comprise oxidized phase change material and/or nitrified phase change material.

14. The phase change memory device of claim 10, wherein the high-resist phase change material patterns comprise oxidized phase change material and wherein the oxidized phase change material comprises tellurium (Te) and/or selenium (Se) and oxygen (O).

15. The phase change memory device of claim 10, wherein the high-resist phase change material patterns comprise nitrified phase change material and wherein the nitrified phase change material comprises tellurium (Te) and/or selenium (Se) and nitrogen (N).

16. The phase change memory device of claim 10, wherein opposing sides of the information storage component are composed of the phase change material patterns.

17. The phase change memory device of claim 10, further comprising a conductive layer on the information storage component to provide a barrier pattern on the information storage component.

18. The phase change memory device of claim 10, further comprising:
    a lower plug connected to a predetermined region of the semiconductor substrate and the information storage component through the lower interlayer dielectric;
    an upper interlayer dielectric on the lower interlayer dielectric and the information storage component;
    an interconnection the upper interlayer dielectric; and
    an upper plug connected to the information storage component and the interconnection through the upper interlayer dielectric.

19. An information storage component of a phase change memory device comprising:
    a plurality of high-resist phase change material patterns interposed between adjacent lower resist phase change material patterns to provide a crystalline-state information storage component configured to change phase of only a portion of the plurality of high-resist phase change material patterns and adjacent lower resist phase change material patterns during heating/cooling.

* * * * *